United States Patent
Kishore et al.

(10) Patent No.: US 10,877,088 B2
(45) Date of Patent: Dec. 29, 2020

(54) IN-SYSTEM STRUCTURAL TESTING OF A SYSTEM-ON-CHIP (SOC) USING A PERIPHERAL INTERFACE PORT

(71) Applicant: QUALCOMM Incorporated, San Diego, CA (US)

(72) Inventors: Punit Kishore, Bangalore (IN); Tomer Rafael Ben-Chen, Amikam (IL); Sharon Graif, Zichron Yakov (IL)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/262,550

(22) Filed: Jan. 30, 2019

(65) Prior Publication Data
US 2020/0241070 A1    Jul. 30, 2020

(51) Int. Cl.
*G01R 31/28* (2006.01)
*G01R 31/3177* (2006.01)
*G01R 31/317* (2006.01)
*G06F 13/42* (2006.01)

(52) U.S. Cl.
CPC ..... *G01R 31/2834* (2013.01); *G01R 31/3177* (2013.01); *G01R 31/31713* (2013.01); *G06F 13/4282* (2013.01); *G06F 2213/0042* (2013.01)

(58) Field of Classification Search
CPC .............. G01R 31/3177; G01R 31/28; G01R 31/31719; G01R 31/318544; G01R 31/2834; G01R 31/713; G01R 31/318533; G01R 31/2851; G06F 11/27; G06F 2213/0042
See application file for complete search history.

(56) References Cited

U.S. PATENT DOCUMENTS

| | | | |
|---|---|---|---|
| 2009/0307546 A1* | 12/2009 | Dunn | G01R 31/31719 714/726 |
| 2011/0273197 A1 | 11/2011 | Banerjee et al. | |
| 2014/0237292 A1 | 8/2014 | Chan | |
| 2015/0039955 A1* | 2/2015 | Chien | G01R 31/318544 714/727 |
| 2016/0146888 A1* | 5/2016 | Vooka | G06F 11/27 714/734 |
| 2017/0337988 A1 | 11/2017 | Yun et al. | |

FOREIGN PATENT DOCUMENTS

WO    2008093312 A1    8/2008

OTHER PUBLICATIONS

Whetsel, A High speed reduced pin count JTAG interface, 2006, IEEE international test conference, pp. 1 to 10.*
Min et al., A functional enhancement methodology to JTAG controller in complex SOC, 2009, IEEE International conference on computer science & education, pp. 1128-1131.*
International Search Report and Written Opinion—PCT/US2020/015696—ISAEPO—dated May 20, 2020.

* cited by examiner

*Primary Examiner* — Shelly A Chase
(74) *Attorney, Agent, or Firm* — Seyfarth Shaw LLP/Qualcomm Incorporated (57) ABSTRACT

A method of in-system structural testing of a system-on-chip (SoC) using a peripheral interface port is described. The method including enabling a scan interface controller of the SoC through the peripheral interface port. The method also includes streaming structural test patterns in the SoC through the scan interface controller.

17 Claims, 9 Drawing Sheets

IN-SYSTEM STRUCTURAL TESTING OF A SYSTEM-ON-CHIP (SOC) USING A PERIPHERAL INTERFACE PORT

BACKGROUND

Field

The present disclosure generally relates to testing of integrated circuits (ICs). More specifically, aspects of the present disclosure relate to in-system structural testing of a system-on-chip (SoC) using a peripheral interface port.

Background

Electronic devices, such as mobile platform devices, are continually driving the demand for testing due to increased computing power and component miniaturization of these electronic devices. In particular, implementing these electronic devices increasingly involves a complex integration of chips as well as advanced packaging techniques to provide increased computing power in a reduced form factor. The complex integration of chips and advanced packaging techniques for implementing these electronic devices is causing an upheaval in the testing industry.

Conventional wisdom may view testing as a single operation that is performed during device manufacturing. Testing, however, generally involves a portfolio of separate operations, where the number of tests is growing as designs become more dissimilar. The amount of testing is also increasing as electronic devices are used in markets such as automotive and industrial markets where chips are expected to last (e.g., 10 to 20 years). In addition, increased system-on-chip (SoC) integration and design complexity are driving a desire for an improved testing strategy.

A chip (e.g., SoC) testing process may include wafer level test (WLT), final test (FT) testing of the device under test (DUT), and system level testing including the DUT (e.g., a chip). FT testing generally involves package level testing using automated test equipment (ATE), which can be quite expensive. By contrast, system level testing (SLT) may be performed using a general-purpose computer rather than an expensive ATE device. For example, FT testing may have a cost of approximately seven (7) cents (¢) per second (7¢/s), while the cost of SLT testing is approximately 0.02¢/s. Consequently, offloading some amount of test content from FT testing to SLT testing is desirable for verifying complex SoC integration and containing cost without increasing defective parts per million (DPPM).

SUMMARY

A method of in-system structural testing of a system-on-chip (SoC) using a peripheral interface port is described. The method including enabling a scan interface controller of the SoC through the peripheral interface port. The method also includes streaming structural test patterns in the SoC through the scan interface controller.

An apparatus configured for in-system structural testing of a system-on-chip (SoC) through a peripheral interface port is described. The apparatus includes a scan interface controller communicably coupled to the peripheral interface port. The scan interface controller is enabled through the peripheral interface port. In addition, the scan interface controller is configured to stream structural test patterns in the SoC. The structural test patterns are received by the scan interface controller through the peripheral interface port.

A non-transitory computer-readable medium having program code recorded thereon for in-system structural testing of a system-on-chip (SoC) using a peripheral interface port is described. The program code is executed by a processor and includes program code to enable a scan interface controller of the SoC through the peripheral interface port. The program code also includes program code to stream structural test patterns in the SoC through the scan interface controller.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily used as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts.

Based on the teachings, one skilled in the art should appreciate that the scope of the disclosure is intended to cover any aspect of the disclosure, whether implemented independently of or combined with any other aspect of the disclosure. For example, an apparatus may be implemented or a method may be practiced using any number of the aspects set forth. The apparatus may, for example, be one of a computing system (e.g., servers, datacenters, desktop computers), mobile computing device (e.g., laptops, cell phones, vehicles, etc.), Internet of Things device, and virtual reality or augmented reality system. In addition, the scope of the disclosure is intended to cover such an apparatus or method practiced using other structure, functionality, or structure and functionality in addition to or other than the various aspects of the disclosure set forth. It should be understood that any aspect of the disclosure disclosed may be embodied by one or more elements of a claim.

As described herein, the use of the term "and/or" is intended to represent an "inclusive OR", and the use of the term "or" is intended to represent an "exclusive OR". The word "exemplary" is used herein to mean "serving as an example, instance, or illustration." Any aspect described herein as "exemplary" is not necessarily to be construed as preferred or advantageous over other aspects.

Although particular aspects are described, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different technologies, system configurations, networks and protocols, some of which are illustrated by way of example in the figures and in the following description of the preferred aspects. The detailed description and drawings are merely illustrative of the disclosure, rather than limiting the scope of the disclosure being defined by the appended claims and equivalents thereof.

Increased system-on-chip (SoC) integration and design complexity are driving a desire for an improved testing strategy. For example, a chip (e.g., SoC) testing process may include wafer level test (WLT) testing, final test (FT) testing of the device under test (DUT), and system level testing including the DUT (e.g., a chip). FT testing generally involves package level testing using automated test environment (ATE), which can be quite expensive. By contrast, system level testing (SLT) may be performed using a general-purpose computer rather than an expensive ATE device. Offloading some amount of test content from FT testing to SLT testing is desirable for containing test cost for complex SoC integration without risking defective parts per million (DPPM).

In operation, there are various scenarios that involve application of structural/ATE test patterns on a system (e.g., during SLT testing). Conventionally, when a manufactured part fails in a customer environment, the part is removed, returned, and sent out for FT testing in an ATE environment. The structural/ATE test patterns would be helpful during in-situ debug at a customer site that fails to rule out any defect-induced failures or to rule out defects in a manufactured part in the system. In addition, these ATE/structural test patterns would be helpful for in-system testing of devices that involve continuous monitoring, such as automotive products. Similarly, remote debugging of a customer product may involve using structural/ATE test patterns. In particular, SLT-based testing using structural/ATE scan patterns would enable higher coverage at a lower test cost. In addition, debugging of test patterns during silicon bring-up may be performed using a low cost system platform when structure/ATE test patterns are available during SLT testing.

Unfortunately, ATE interfaces that are specified for applying these patterns are not available during SLT testing. Conventional manufacturing testing usually involves a wide bus for implementing a test interface that supports driving of high bandwidth test patterns. Although a general-purpose input/output (GPIO) may have a wide bus, a GPIO interface is generally unavailable in a customer environment due to support for some customer specific activity. Aspects of the present disclosure are directed to moving a significant portion of structural/ATE pattern testing from the FT testing stage to the SLT testing stage. According to one aspect of the present disclosure, a standard width, peripheral device port is used to provide an ATE interface for SLT testing.

Figure 1:
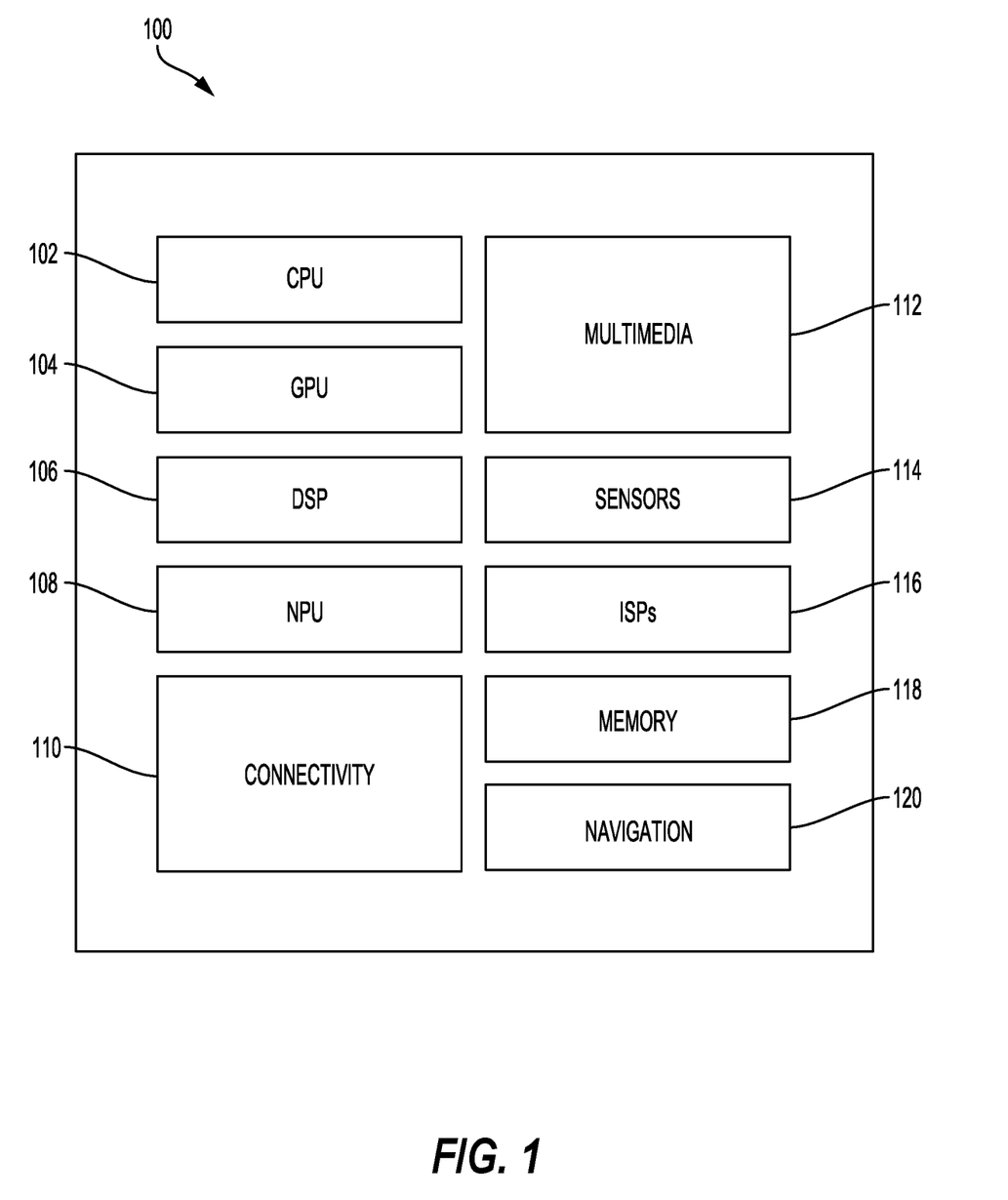
FIG. 1 illustrates an example implementation of a system-on-chip (SoC), including a connectivity module, in accordance with certain aspects of the present disclosure.

FIG. 1 illustrates an example implementation of a host system-on-chip (SoC) 100, which includes a connectivity block 110 (e.g., a host controller) configured to drive ATE/structural test patterns during system level testing (SLT), in accordance with aspects of the present disclosure. The host SoC 100 includes processing blocks tailored to specific functions, such as a connectivity block 110. The connectivity block 110 may include fifth generation (5G) connectivity, fourth generation long term evolution (4G LTE) connectivity, Wi-Fi connectivity, USB connectivity, Bluetooth connectivity, Secure Digital (SD) connectivity, and the like.

In this configuration, the host SoC 100 includes various processing units that support multi-threaded operation. For the configuration shown in FIG. 1, the host SoC 100 includes a multi-core central processing unit (CPU) 102, a graphics processor unit (GPU) 104, a digital signal processor (DSP) 106, and a neural processor unit (NPU) 108. The host SoC 100 may also include a sensor processor 114, image signal processors (ISPs) 116, a navigation module 120, which may include a global positioning system, and a memory 118. The multi-core CPU 102, the GPU 104, the DSP 106, the NPU 108, and the multi-media engine 112 support various functions such as video, audio, graphics, gaming, artificial networks, and the like. Each processor core of the multi-core CPU 102 may be a reduced instruction set computing (RISC) machine, an advance RISC machine (ARM), a microprocessor, or some other type of processor. The NPU 108 may be based on an ARM instruction set.

In an aspect of the present disclosure, the instructions loaded into the multi-core CPU 102 may include program code to enable a scan interface controller of the SoC through the peripheral interface port. The instructions loaded into the multi-core CPU 102 may also include program code to stream structural test patterns in the SoC through the scan interface controller.

Figure 2:
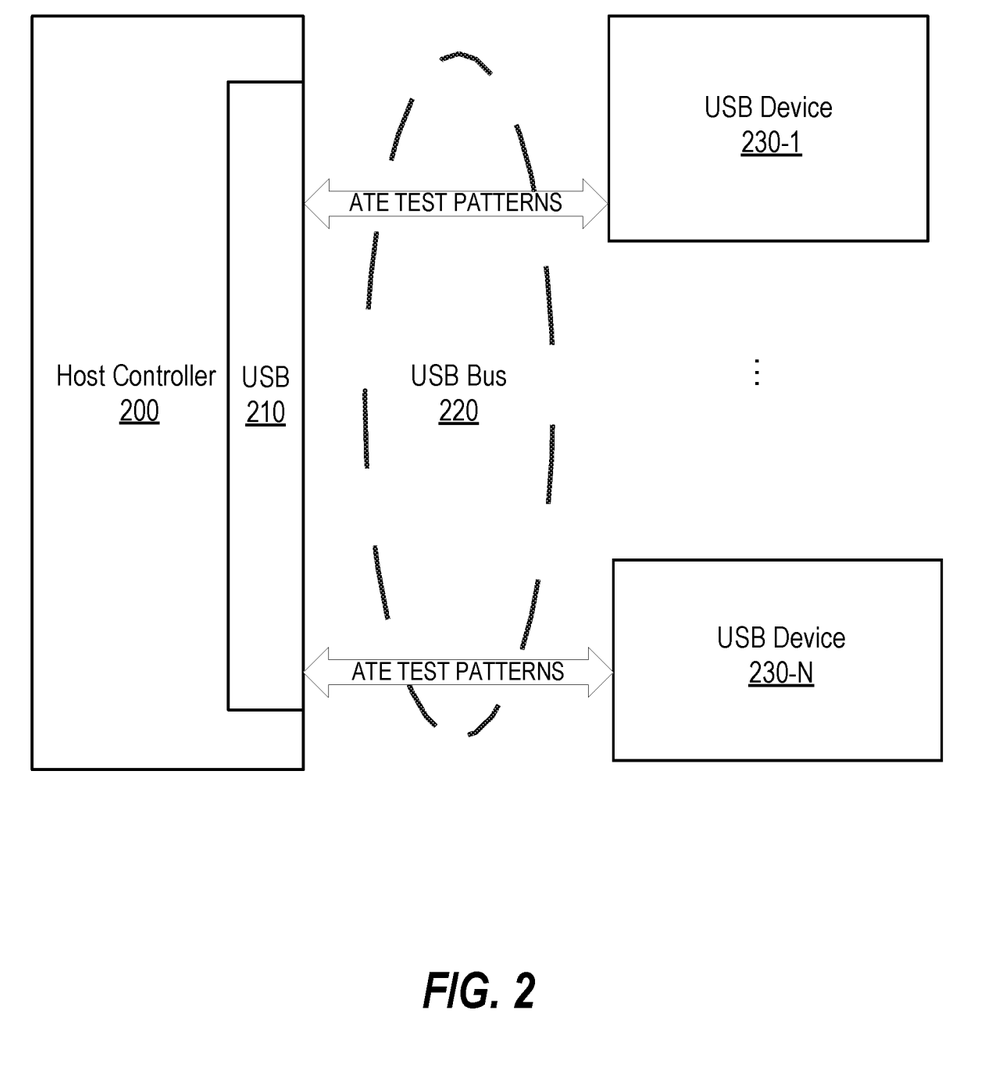
FIG. 2 is an example implementation illustrating a host controller communicably coupled to universal serial bus (USB) devices, in accordance with aspects of the present disclosure.

FIG. 2 is an example implementation illustrating a host controller configured to drive automated test environment (ATE)/structural test patterns during system level testing (SLT), in accordance with aspects of the present disclosure. In this configuration, a host controller 200 may be the host SoC 100, or a block of the host SoC 100 (e.g., connectivity block 110 or other like block of the host SoC 100) including a universal serial bus (USB) interface 210. In this example, the host controller 200 includes the USB interface 210, configured to communicate with USB devices 230 (230-1, . . . , 230-N) over, for example, a USB bus 220.

In this configuration, the USB interface 210 (e.g., a USB subsystem) as well as the host controller 200 (e.g., a USB host controller) are modified to support an ATE interface for applying structural test patterns during SLT testing. Conventional manufacturing testing usually involves a wide bus for implementing a test interface that supports high bandwidth test patterns, rather than the USB interface 210. Aspects of the present disclosure are directed to moving a significant portion of structural/ATE pattern testing from the FT testing stage to the SLT testing stage. In this configuration, the USB interface 210 is modified to provide an ATE interface for SLT testing.

Figure 3:
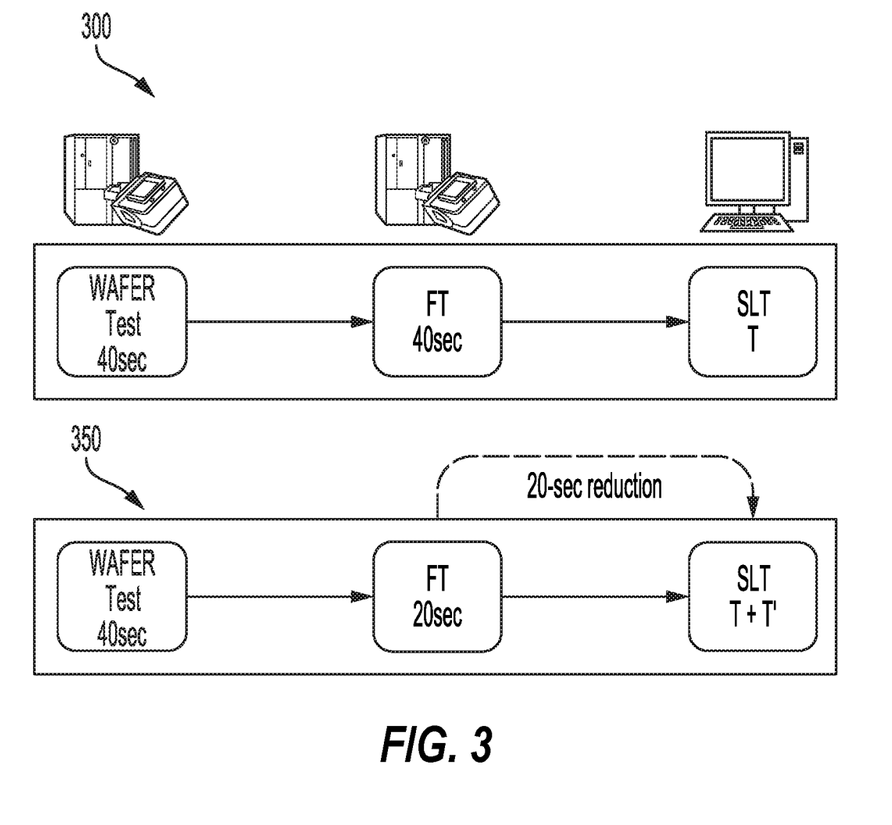
FIG. 3 is a block diagram comparing a conventional testing process, and an offloaded in-system testing process, according to aspects of the present disclosure.

FIG. 3 is a block diagram comparing a conventional testing process 300, and an offloaded in-system testing process 350, according to aspects of the present disclosure. In this example, both the conventional testing process 300 and the offloaded in-system testing process 350 include a wafer level test (WLT) stage, a final test (FT) stage, and a system level test (SLT) stage. In this aspect of the present disclosure, a significant portion of the FT phase is moved to the SLT stage of the offloaded in-system testing process 350. In this example, the FT stage is reduced by twenty (20) seconds by performing ATE/structural testing during the SLT phase. In operation, the FT phase may have a cost of approximately seven (7) cents (¢) per second (7¢/s), while the cost of SLT phase is approximately 0.02¢/s. So offloading, for example, twenty (20) seconds of test content from the FT stage to the SLT stage can result in savings of approximately fourteen (14=20*0.7) cents per device (assuming a cost of 0.7 cents/second/device) relative to the FT stage (e.g., ATE device cost).

Figure 4:
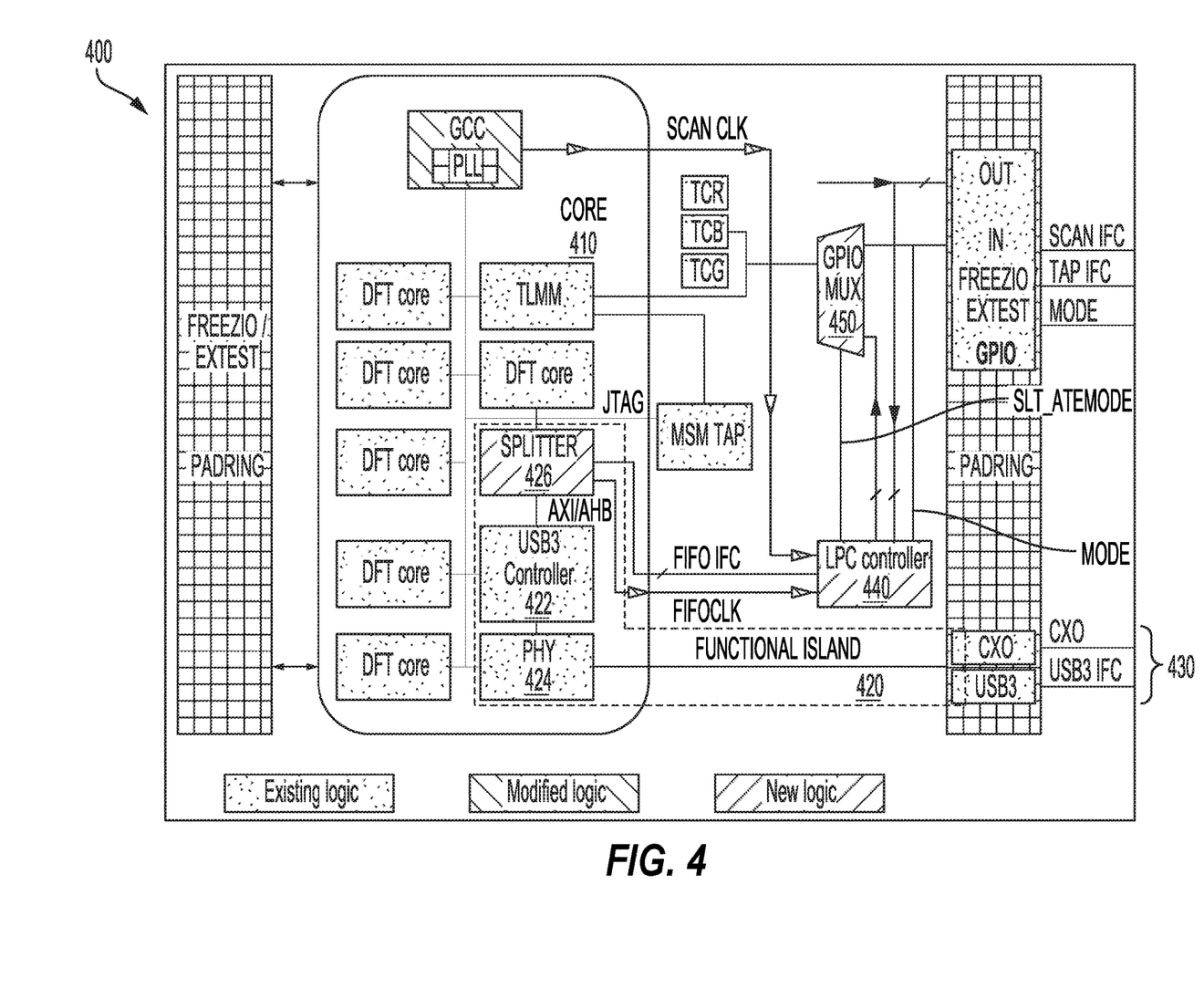
FIG. 4 is a block diagram illustrating a hardware architecture configured to drive automated test equipment (ATE)/structural test patterns during system level testing (SLT), according to aspects of the present disclosure.

FIG. 4 is a block diagram illustrating a hardware architecture configured to drive automatic test equipment (ATE)/structural test patterns during system level testing (SLT), according to aspects of the present disclosure. In this configuration, a hardware architecture 400 includes a system-on-chip (SoC) core 410 having a universal serial bus (USB) subsystem 420 coupled between pad rings, including a general-purpose input/output (GPIO). The USB subsystem 420 includes a USB device controller 422 and a physical layer (PHY) block 424 coupled to a USB port 430. In aspects of the present disclosure, the USB subsystem 420 is modified to provide an ATE test interface for system level testing (SLT) of a device under test (DUT), for example, as shown in FIG. 5.

In conventional operation, the USB subsystem 420 enters a mission mode when other system components of the SoC core 410 are active (e.g., a central processing unit (CPU), a network-on-chip (NoC), and/or a dynamic random access memory (DRAM)). In this aspect of the present disclosure, the USB subsystem 420 is reconfigured to operate in a mission mode without activation of the other noted system components of the SoC core 410. The USB subsystem 420 is also isolated from other components of the hardware architecture 400 to provide a functional island (as shown be the dash lines enclosing the USB subsystem 420). The other components include DFT (design for testability) cores, a global clock controller (GCC), a multiplexer logic (TLMM) a mobile station modem (MSM) TAP, a test control register (TCR), a test clock block (TCB), and a test clock generator (TCG).

In this configuration, the USB subsystem 420 includes a splitter 426, which may be configured to split, for example, an advanced extensible interface (AXI) bus from an advanced high performance bus (AHB) to a first-in-first-out (FIFO) interface (e.g., FIFO IFC and FIFO CLK) of a controller 440. The hardware architecture 400 is further modified to include the controller 440 (e.g., a low pin count (LPC) controller) and a general-purpose input/output (GPIO) multiplexer (GPIO MUX) 450. In this configuration, a high-speed (HS) mode, a super-speed (SS) mode, and/or a super-speed plus (SSP) mode of the USB subsystem 420 operates in combination with the controller 440 and the GPIO mux 450. In this configuration, the controller 440 and the GPIO mux 450 are configured to drive ATE/structural test patterns to a DUT according to, for example, an SLT_ATEMODE signal.

Figure 5:
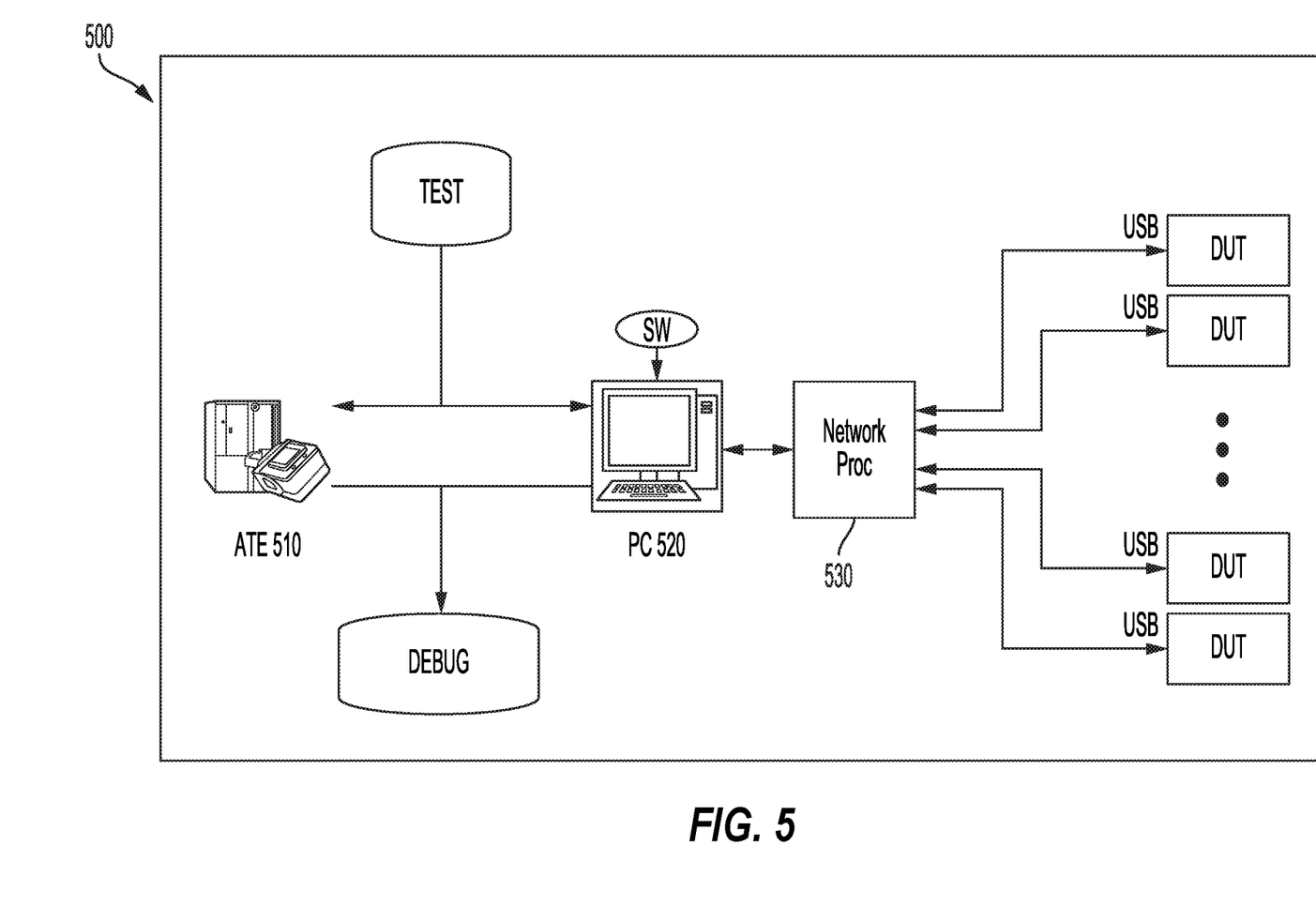
FIG. 5 is a block diagram illustrating a system architecture configured to drive automated test equipment (ATE)/structural test patterns during system level testing (SLT), according to aspects of the present disclosure.

FIG. 5 is a block diagram illustrating a system architecture configured to drive automatic test equipment (ATE)/structural test patterns during system level testing (SLT), according to aspects of the present disclosure. In this configuration, a system architecture 500 includes a low cost personal computer (PC) 520 that replaces an expensive ATE 510 for driving test patterns (e.g., from a test block) to USB ports of DUT through a network processor 530 according to testing software (SW). The PC 520 may operate according to a process of reading automated test equipment (ATE) vectors, and transmitting ATE vectors through a peripheral interface port of an SoC including a DUT. The system architecture 500 enables driving of ATE/structural test patterns using the low cost PC 520 in place of the expensive ATE 510 for debugging the DUT according to, for example, a debug block. Modification of a USB subsystem to enable driving of ATE/structural test patterns is further illustrated in FIG. 6.

Figure 6:
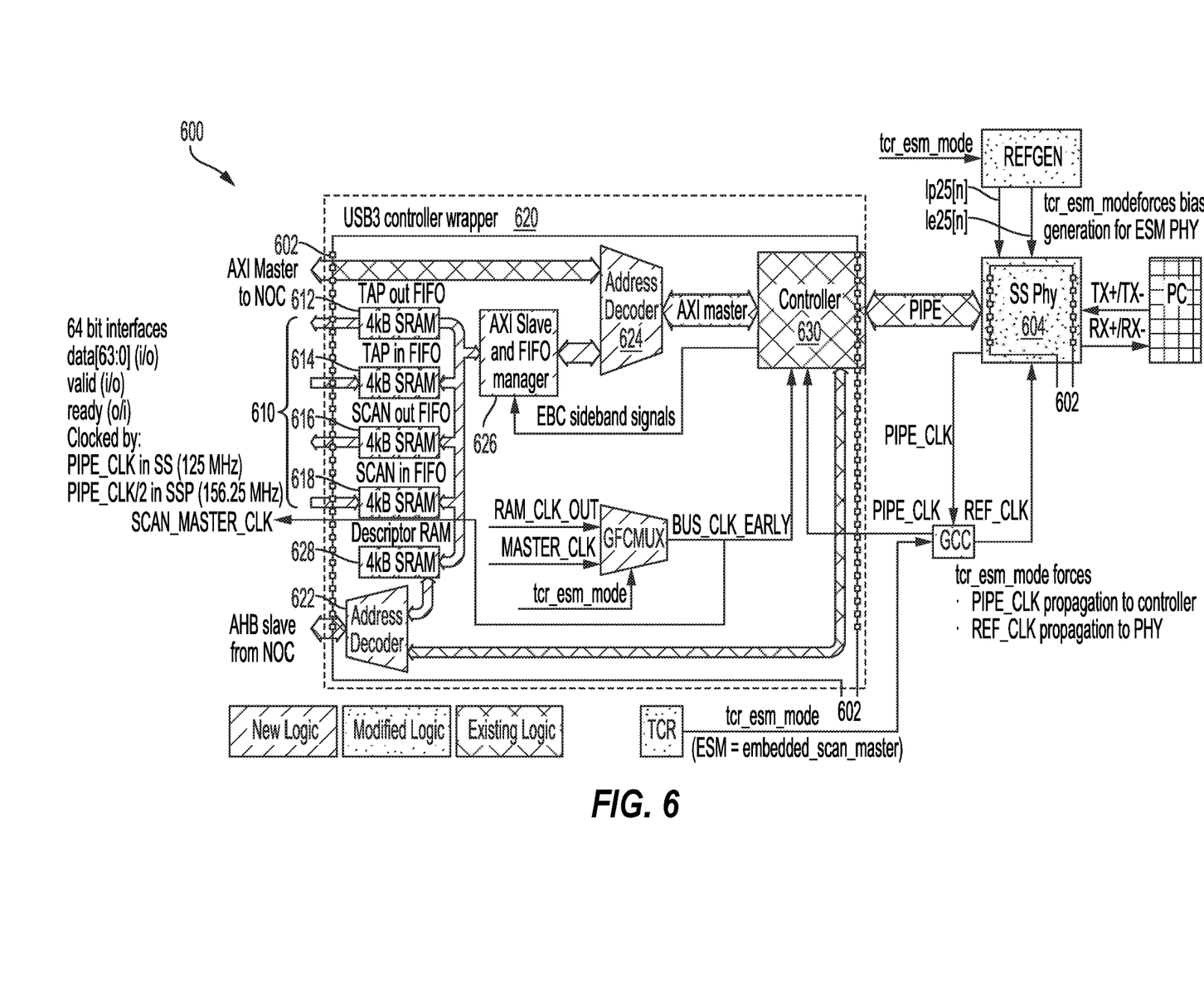
FIG. 6 is a block diagram illustrating a modified universal serial bus (USB) subsystem, in which a USB controller wrapper is reconfigured to drive automatic test equipment (ATE)/structural test patterns during system level testing (SLT), according to aspects of the present disclosure.

FIG. 6 is a block diagram illustrating a modified universal serial bus (USB) subsystem, in which a USB controller wrapper is reconfigured to drive automatic test equipment (ATE)/structural test patterns during system level testing (SLT), according to aspects of the present disclosure. In this configuration, a USB subsystem 600 includes a USB controller wrapper 620 having a controller 630 and mask logic 602. The mask logic 602 is configured to prevent external values from affecting the driving of ATE/structural test patterns during SLT.

The USB controller wrapper 620 is modified to provide a test interface 610 (e.g., a 64-bit test interface of data[63:0]) that is clocked according to a super-speed (SS) mode or a super-speed plus (SSP) mode to drive the ATE/structural test patterns during SLT. In this aspect of the present disclosure, the test interface 610 provides a scan interface to an LPC controller (e.g., controller 440 of FIG. 4) for writing ATE/structural testing patterns from the test interface 610 to a device under test (DUT) and reading test result data from the DUT.

In this configuration, the test interface 610 includes test buffers for storing ATE/structural test patterns as well as test results read from the DUT. The test buffers include output first-in-first-out (FIFO) buffers 612 and 616 and input FIFO buffers 614 and 618, implemented using, for example, four-kilobyte (4 kB) static random access (SRAM) buffers. The USB controller wrapper 620 also includes a FIFO manager 626, a first address decoder 622, a second address decoder 624, and a descriptor buffer 628. The descriptor buffer 628 may operate a lookup table for performing the ATE/structural pattern testing during the SLT stage.

In this example, the first address decoder 622 is coupled between a network-on-chip (NoC) and the controller 630 over a first bus (e.g., advanced high performance bus (AHB)). The second address decoder 624 is also coupled between the NoC (not shown) and the controller 630 over a second bus (e.g., an advanced extensible interface (AXI) bus). In this example, test data (e.g., ATE/structural test patterns and results) decoded by the first address decoder 622 and/or the second address decoder 624 decodes into an address allocated for ATE/structural pattern testing during an SLT stage for directing the test data to the test buffers of the test interface 610. The descriptor buffer 628 stores descriptor information to enable the ATE/structural pattern testing during the SLT stage. This descriptor information may be used by the controller 440 to access the test buffers (e.g., 612, 614, 616, 618) of the test interface 610 as well as the descriptor buffer.

In one configuration, the first address decoder 622 in conjunction with the descriptor buffer 628 may be configured to read results of ATE/structural pattern testing during SLT. By contrast, the second address decoder 624 and the FIFO manager 626 may be configured to write the ATE/structural test patterns to a DUT (not shown) during SLT. A multiplexer (e.g., GFCMUX) receives input clock signals (e.g., RAM_CLK_OUT and MASTER_CLK) and a mode signal (e.g. tcr_esm_mode) to generate an output clock signal (e.g., BUS_CLK_EARLY/SCAN_MASTER_CLK) to provided timing for the controller 630. The controller 630 also provides sideband signals (e.g., EBC sideband signals) to the FIFO manager.

As further illustrated in FIG. 6, a physical layer (PHY) block 604 couples a PC (e.g., PC 520 of FIG. 5) to the controller 630. In this configuration, the PHY block 604 is coupled to the controller 630 through a pipe and to the PC through transmit/receive lanes (e.g. TX+/TX− and RX+/RX−). A global clock control (GCC) block is coupled to a TCR block to receive a mode signal (e.g., an embedded scan master (ESM) signal tcr_esm_mode). This mode signal forces the GCC block to provide a reference clock (REF CLK) signal to the PHY block 604 and propagate a clock signal (e.g., PIPE_CLK) to the controller 630. A reference generation (REFGEN) block is configured to provide bias signals (e.g., Ip25[n] and Ie25[n]) to the PHY block 604 in response to the ESM mode signal (e.g., tcr_esm_mode). Configuration of the USB subsystem 600 is further described with reference to FIGS. 7 and 8.

Figure 7:
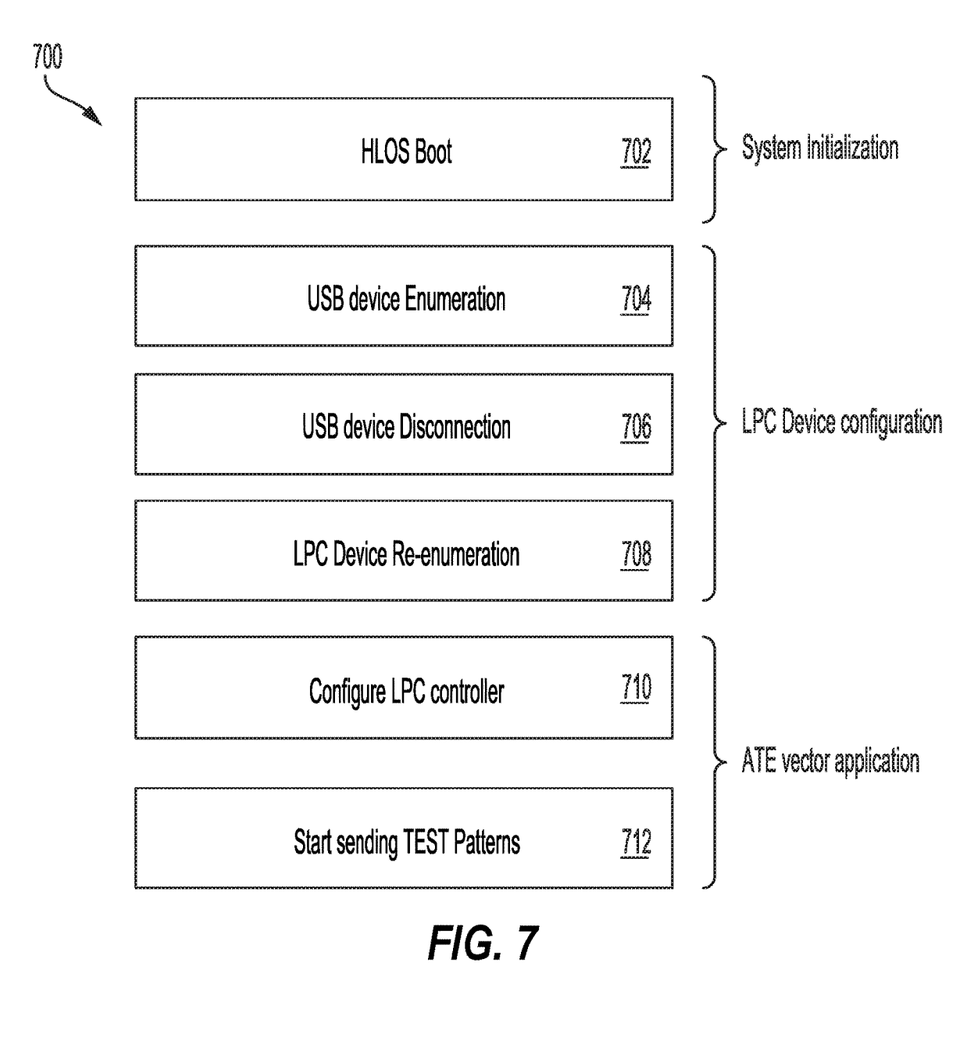
FIG. 7 is a flow chart illustrating a method of configuring a USB subsystem to drive automatic test equipment (ATE)/structural test patterns during system level testing (SLT), according to aspects of the present disclosure.

FIG. 7 is a flow chart illustrating a method of configuring a USB subsystem to drive automatic test equipment (ATE)/structural test patterns during system level testing (SLT), according to aspects of the present disclosure. Representatively, a method 700 begins at block 702 in which a high-level operating system (HLOS) boot process is performed as part of a system initialization process. At block 704, a USB device enumeration process is performed. For example, as shown in FIG. 4, the USB enumeration process is performed to enumerate the USB device controller 422.

In this configuration, a low pin count (LPC) device configuration process is initiated, for example, by sending a command packet to the USB device controller 422 to trigger a USB-LPC test mode according to a requested speed (e.g., high-speed (HS), super-speed (SS), or super-speed plus (SSP) mode). Once initiated, at block 706, a USB device disconnection is initiated by, for example, the USB device controller 422. At block 708, an LPC device re-enumeration process is performed to complete the LPC device configuration process. In this example, the USB device controller 422 undergoes a re-initializing as an LPC scan device according to the requested speed by selecting a pipe clock signal (e.g., PIPE_CLK in FIG. 6) corresponding to the requested speed. In this aspect of the present disclosure, the USB device controller 422 is re-initialized as an LPC scan device that provides a link to send ATE/structural test patterns to a DUT through the controller 440.

Referring again to FIG. 7, block 710 configures an LPC controller. For example, as shown in FIG. 4, the controller 440 is configured as an LPC scan interface controller. This configuration may include definition of an input pipe and an output pipe of the LPC scan interface controller. Once the LPC scan interface is configured, at block 712, an ATE vector application process starts sending test patterns to the LPC scan interface through pins of an exposed USB port. This process is further described in FIG. 8.

Figure 8:
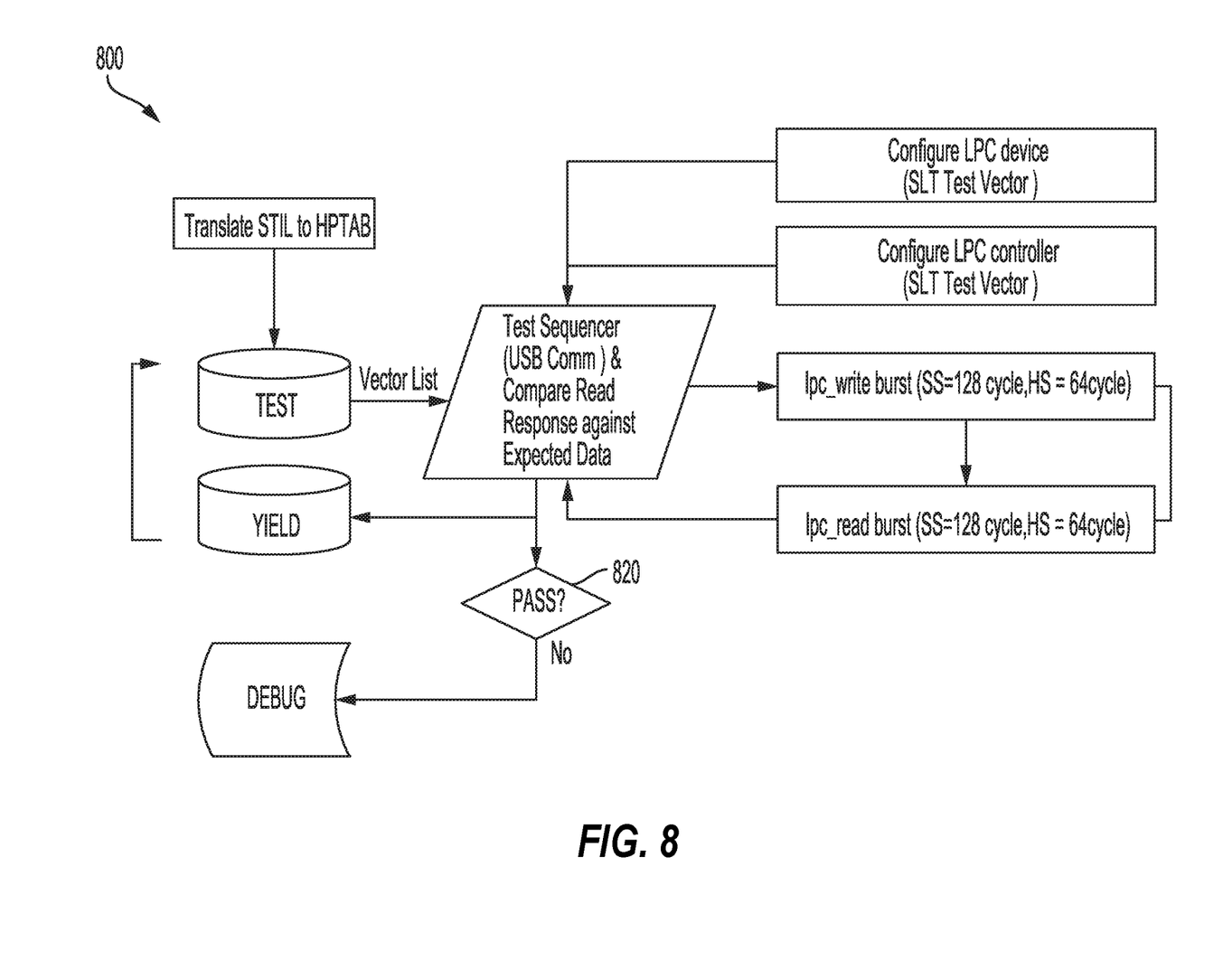
FIG. 8 is a flow diagram illustrating a method of in-system structural testing of a system-on-chip (SoC) using a peripheral interface port, according to aspects of the present disclosure.

FIG. 8 is a flow diagram illustrating a method of in-system structural testing of a system-on-chip (SoC) using a peripheral interface port, according to aspects of the present disclosure. A method 800 begins at block 802, in which an LPC device is configured. For example, as shown in FIG. 4, the USB device controller 422 is disconnected and reinitialized as an LPC scan device. At block 804, an LPC controller is configured. For example, as shown in FIG. 4, the controller 440 is configured as an LPC scan interface for driving ATE vector test patterns to a DUT of, for example, the SoC core 410.

Referring again to FIG. 8, at block 806, translation of an ATE vector is performed. In this configuration, the translation process may include separating the ATE vector (e.g., a standard test interface language (STIL) vector) into write operations (e.g., lpc_write( )) and read operations (e.g., lpc_read( )), which are stored (e.g., in TEST). This ATE vector list is processed at block 810 to initiate block 812 and block 814. At block 812 a write burst of ATE/structural test patterns is performed at the selected speed (e.g., lpc_wirte burst (super speed (SS)=128 cycles, high speed (HS)=64 cycles)). At block 814, a read burst of expected ATE/structure test pattern data is performed.

The process shown in FIG. 8 may include writing a burst of automatic test equipment (ATE) vectors (e.g., using a standard test interface language (STIL) to define ATE/structure test patterns) to a peripheral interface port of an SoC (e.g., SoC core 410 of FIG. 4). This is followed by reading a burst of result ATE vector data through the peripheral interface port. Block 810 includes comparing the result ATE vector data to expected ATE vector data. Based on the comparison, at block 820 it is determined whether a device under test (DUT) passed the ATE/structural testing during an SLT stage. When the DUT passes, the DUT is added to the yield. Otherwise, the DUT undergoes debugging.

Aspects of the present disclosure are directed to in-system structural testing of a system-on-chip (SoC) using a peripheral interface port. Although described with reference to a universal serial bus (USB) port, it should be recognized that the described in-system structural testing may be applied to other peripheral interface ports. Furthermore, although implementation of a scan interface is described using an LPC controller, it should be recognized that the scan interface may be implemented using other controller protocols. Implementation of ATE/structural test patterns during SLT testing is beneficial by expanding on the ATE/structural test patterns available from an ATE test device. Furthermore, offloading a portion of ATE/structure testing from the FT test stage to the SLT test stage provides significant cost savings.

Figure 9:
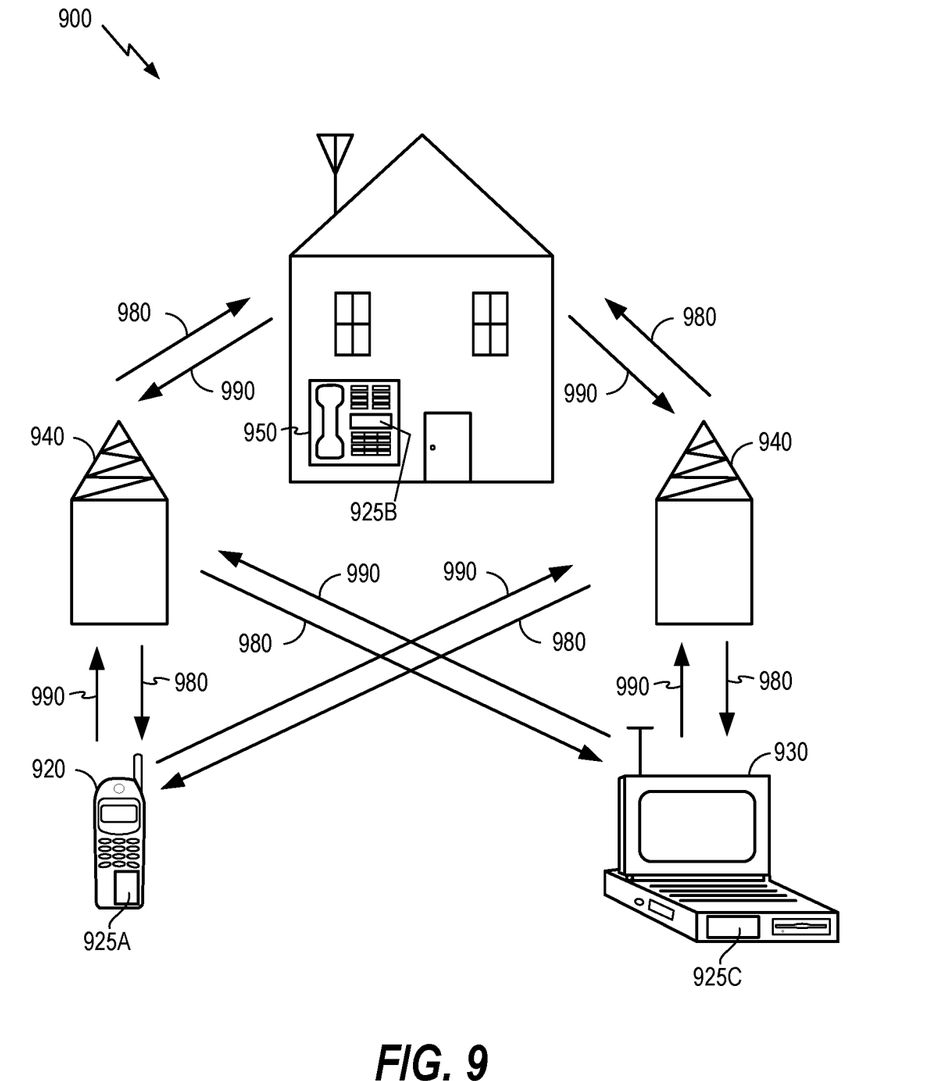
FIG. 9 is a block diagram showing a wireless communications system in which a configuration of the disclosure may be advantageously employed.

FIG. 9 is a block diagram showing an exemplary wireless communications system 900 in which a configuration of the disclosure may be advantageously employed. For purposes of illustration, FIG. 9 shows three remote units 920, 930, and 950 and two base stations 940. It will be recognized that wireless communications systems may have many more remote units and base stations. Remote units 920, 930, and 950 include IC devices 925A, 925B, and 925C, which include the disclosed scan interface. It will be recognized that any device containing an IC may also include the disclosed scan interface, including the base stations, switching devices, and network equipment. FIG. 9 shows forward link signals 980 from the base station 940 to the remote units 920, 930, and 950, and reverse link signals 990 from the remote units 920, 930, and 950 to base stations 940.

In FIG. 9, a remote unit 920 is shown as a mobile telephone, a remote unit 930 is shown as a portable computer, and a remote unit 950 is shown as a fixed location remote unit in a wireless local loop system. For example, the remote units may be a mobile phone, a hand-held personal communications systems (PCS) unit, a portable data unit such as a personal data assistant, a GPS enabled device, a navigation device, a set top box, a music player, a video player, an entertainment unit, a fixed location data unit such as meter reading equipment, or any other device that stores or retrieves data or computer instructions, or any combination thereof. For example, a remote unit including the scan interface may be integrated within a vehicle control system, a server computing system or other like system specifying critical operation integrity. Although FIG. 9 illustrates IC devices 925A, 925B, and 925C, which include the disclosed scan interface, the disclosure is not limited to these exemplary illustrated units. Aspects of the present disclosure may be suitably employed in any device, which includes the scan interface.

For a firmware and/or software implementation, the methodologies may be implemented with modules (e.g., procedures, functions, and so on) that perform the described functions. Any machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to any type of long term, short term, volatile, nonvolatile, or other memory and is not to be limited to any particular type of memory or number of memories, or type of media upon which memory is stored.

If implemented in firmware and/or software, the functions may be stored as one or more instructions or code on a non-transitory computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer. Disk and disc, as used herein, include compact disc (CD), laser disc, optical disc, digital versatile disc (DVD) and Blu-ray disc where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communications apparatus. For example, a communications apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communications media including any medium that facilitates transfer of a computer program from one place to another. A storage media may be any available media that can be accessed by a general-purpose or special-purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD) and Blu-ray disc, where disks usually reproduce data magnetically, while discs reproduce data optically with lasers. Combinations of the above should also be included within the scope of computer-readable media.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b, and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "a step for."

What is claimed is:

1. A method of in-system structural testing of a system-on-chip (SoC) using a peripheral interface port, the method comprising:
    enabling a scan interface controller of the SoC through the peripheral interface port; and
    streaming structural test patterns in the SoC through the scan interface controller by:
        writing a burst of automatic test equipment (ATE) vectors to the peripheral interface port;
        reading a burst of result ATE vector data through the peripheral interface port; and
        comparing the result ATE vector data to expected ATE vector data.

2. The method of claim 1, in which the peripheral interface port comprises a universal serial bus (USB) port and the scan interface controller comprises a low pin count (LPC) controller.

3. The method of claim 2, in which enabling the scan interface controller comprises:
    disconnecting a USB device controller;
    re-initializing the USB device controller as an LPC scan device; and
    configuring the LPC controller as an LPC scan controller according to a USB-LPC test mode.

4. The method of claim 2, further comprising transmitting a command packet to a USB device controller to enter a USB-LPC test mode.

5. The method of claim 1, in which writing comprises:
    reading the burst of automated test equipment (ATE) vectors; and
    transmitting the burst of ATE vectors through the peripheral interface port.

6. The method of claim 1, in which enabling further comprises configuring a device under test (DUT) of the SoC into a USB-LPC test mode.

7. An apparatus configured for in-system structural testing of a system-on-chip (SoC) through a peripheral interface port, comprising:
    a scan interface controller communicably coupled to the peripheral interface port, in which the scan interface controller is enabled through the peripheral interface port and configured to stream structural test patterns in the SoC, in which the structural test patterns are received through the peripheral interface port; and
    a test interface coupled to the SoC, in which the scan interface is further configured to write a burst of automated test equipment (ATE) vectors from the test interface to a device under test (DUT), configured to read a burst of result ATE test data from the DUT, and configured to compare the result ATE vector data to expected ATE vector data.

8. The apparatus of claim 7, in which the test interface comprises a 64-bit test interface of data, clocked according to a super-speed (SS) mode or a super-speed plus (SSP) mode to drive the ATE/structural test patterns during a system level test (SLT).

9. The apparatus of claim 7, in which the peripheral interface port comprises a universal serial bus (USB) port.

10. The apparatus of claim 7, in which the scan interface controller comprises a low pin count (LPC) controller.

11. The apparatus of claim 7, comprising one of computing system, mobile computing device, Internet of Things device, or virtual reality or augmented reality system, incorporating the scan interface controller.

12. A non-transitory computer-readable medium having program code recorded thereon for transitioning gear speeds for in-system structural testing of a system-on-chip (SoC) using a peripheral interface port, the program code executed by a processor and comprising:
    program code to enable a scan interface controller of the SoC through the peripheral interface port; and
    program code to stream structural test patterns in the SoC through the scan interface controller by:
        writing a burst of automatic test equipment (ATE) vectors to the peripheral interface port;
        reading a burst of result ATE vector data through the peripheral interface port; and
        comparing the result ATE vector data to expected ATE vector data.

13. The non-transitory computer-readable medium of claim 12, in which the peripheral interface port comprises a universal serial bus (USB) port and the scan interface controller comprises a low pin count (LPC) controller.

14. The non-transitory computer-readable medium of claim 13, in which the program code to enable the scan interface controller comprises:
    program code to disconnect a USB device controller;
    program code to re-initialize the USB device controller as an LPC scan device; and
    program code to configure the LPC controller as an LPC scan controller according to a USB-LPC test mode.

15. The non-transitory computer-readable medium of claim 13, further comprising program code to transmit a command packet to a USB device controller to enter a USB-LPC test mode.

16. The non-transitory computer-readable medium of claim 12, in which writing further comprises:
    program code to read the burst of automated test equipment (ATE) vectors; and
    program code to transmit the burst of ATE vectors through the peripheral interface port.

17. The non-transitory computer-readable medium of claim 12, in which the program code to enable further comprises program code to configure a device under test (DUT) of the SoC into a USB-LPC test mode.

* * * * *